(12) United States Patent
Noordman (10) Patent No.: US 7,626,182 B2
(45) Date of Patent: Dec. 1, 2009

(54) RADIATION PULSE ENERGY CONTROL SYSTEM, LITHOGRAPHIC APPARATUS AND DEVICE MANUFACTURING METHOD

(75) Inventor: Oscar Franciscus Jozephus Noordman, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 514 days.

(21) Appl. No.: 11/515,378

(22) Filed: Sep. 5, 2006

(65) Prior Publication Data

US 2008/0054190 A1    Mar. 6, 2008

(51) Int. Cl.
    *G03F 7/20* (2006.01)
(52) U.S. Cl. .................. 250/492.2; 372/25; 355/268
(58) Field of Classification Search ............... 250/492.2
    See application file for complete search history.

(56) References Cited

U.S. PATENT DOCUMENTS

| 5,229,872 | A | 7/1993 | Mumola |
|---|---|---|---|
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,852,621 | A * | 12/1998 | Sandstrom ............... 372/25 |
| 5,982,553 | A | 11/1999 | Bloom et al. |
| 6,133,986 | A | 10/2000 | Johnson |
| 6,177,980 | B1 | 1/2001 | Johnson |
| 6,501,535 | B1 * | 12/2002 | Ozawa ..................... 355/68 |
| 6,687,041 | B1 | 2/2004 | Sandstrom |
| 6,747,783 | B1 | 6/2004 | Sandstrom |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 2004/0041104 | A1 | 3/2004 | Liebregts et al. |
| 2004/0130561 | A1 | 7/2004 | Jain |
| 2005/0007572 | A1 | 1/2005 | George et al. |

FOREIGN PATENT DOCUMENTS

| WO | WO 98/33096 | 7/1998 |
|---|---|---|
| WO | WO 98/38597 | 9/1998 |

* cited by examiner

*Primary Examiner*—David A. Vanore
*Assistant Examiner*—Phillip A. Johnston
(74) *Attorney, Agent, or Firm*—Sterne, Kessler, Goldstein & Fox P.L.L.C.

(57) ABSTRACT

A system for controlling the energy of radiation pulses. A detector monitors energy of the pulses and an optical shutter trims the radiation pulses after a suitable optical delay line. The accuracy of the control of the energy of the radiation pulses can be improved by matching a rate of response of the radiation detector to a rate of response of the optical shutter.

11 Claims, 5 Drawing Sheets

RADIATION PULSE ENERGY CONTROL SYSTEM, LITHOGRAPHIC APPARATUS AND DEVICE MANUFACTURING METHOD

BACKGROUND

1. Field of the Invention

The present invention relates to a radiation pulse energy control system, a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Radiation sources typically used with a lithographic apparatus include pulsed laser sources. Typically, for a mask-based lithographic apparatus, excimer lasers are used and several tens of laser pulses are used to expose each pattern on a part of a substrate. A problem with excimer lasers is that there is a random variation of pulse energy of plus or minus about 10% of the intended energy for each pulse. However, by using a fast control algorithm and the fact that the exposure dose on the substrate is typically made up from about 40 to 60 pulses, the variation of the energy dose received at the substrate is typically of the order of plus or minus about 0.1% or below.

In a maskless apparatus, because the size of the image projected onto the substrates at any one instant is relatively small, and in order to provide an adequate throughput of substrate through the lithographic apparatus, the pattern set by the patterning device can be imaged onto the substrate using a single pulse of the radiation system. However, for a single pulse, as discussed above, the energy variation can be plus or minus about 10%. Such a variation in the energy of the pulse results in an unacceptably high variation in the line width produced on the substrate. Even if two or three pulses of radiation are used to expose each image, sufficient dose energy control (which can be required to be plus or minus about 0.5% or better) is not attainable.

To date, excimer lasers with improved pulse energy stability have not been produced. It has therefore previously been proposed to trim the energy in each pulse of radiation by a variable amount, such that the resulting pulses of radiation have less variation. In order to achieve this, it has been proposed to use a "fast" detector to detect the energy in an input pulse of radiation, an optical delay line, and a "fast" optical shutter to trim a portion of the energy from the pulse. For a viable system, it has been proposed that both the "fast" detector and the optical shutter have nano-second response times. For the optical shutter, it has been proposed to use a Pockels cell that uses an electro-optic material. However, a suitable electro-optic material is difficult to identify. In particular, the material must have high radiation transmission (in order to maximize the radiation dose available for imaging and in order to avoid heating of the Pockels cell), a long reliable lifetime, and a high switching speed such that the optical shutter can trim a portion of the pulse of radiation. As an additional requirement, all of these capabilities must be provided for use with radiation at a wavelength that is suitable for the lithographic process, for example about 193 nm.

Therefore, what is needed is a system and method for providing pulses of radiation suitable for use in lithography with improved radiation pulse energy consistency.

SUMMARY

In one embodiment of the present invention, there is provided a radiation pulse energy control system configured to control the energy in a pulse of radiation passing through the system comprising a radiation detector and an optical shutter. The radiation detector is configured to monitor the energy in a pulse of radiation. The optical shutter is configured to close in response to the radiation detector in order to trim part of the pulse of radiation passing through the system. The radiation detector is configured such that the speed of response of the radiation detector is the same as the speed of response of the optical shutter.

In another embodiment, there is provided a lithographic apparatus incorporating a radiation pulse energy control system as discussed above.

In a further embodiment, there is provided a device manufacturing method comprising the following steps. Modulating a pulsed beam of radiation and projecting it onto a substrate. Each pulse of the pulsed beam of radiation undergoes an energy control process in which: the energy in the pulse of radiation is monitored by a radiation detector. The pulse of radiation is trimmed by the closure of an optical shutter. The speed of response of the radiation detector is the same as the speed of response of the optical shutter.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
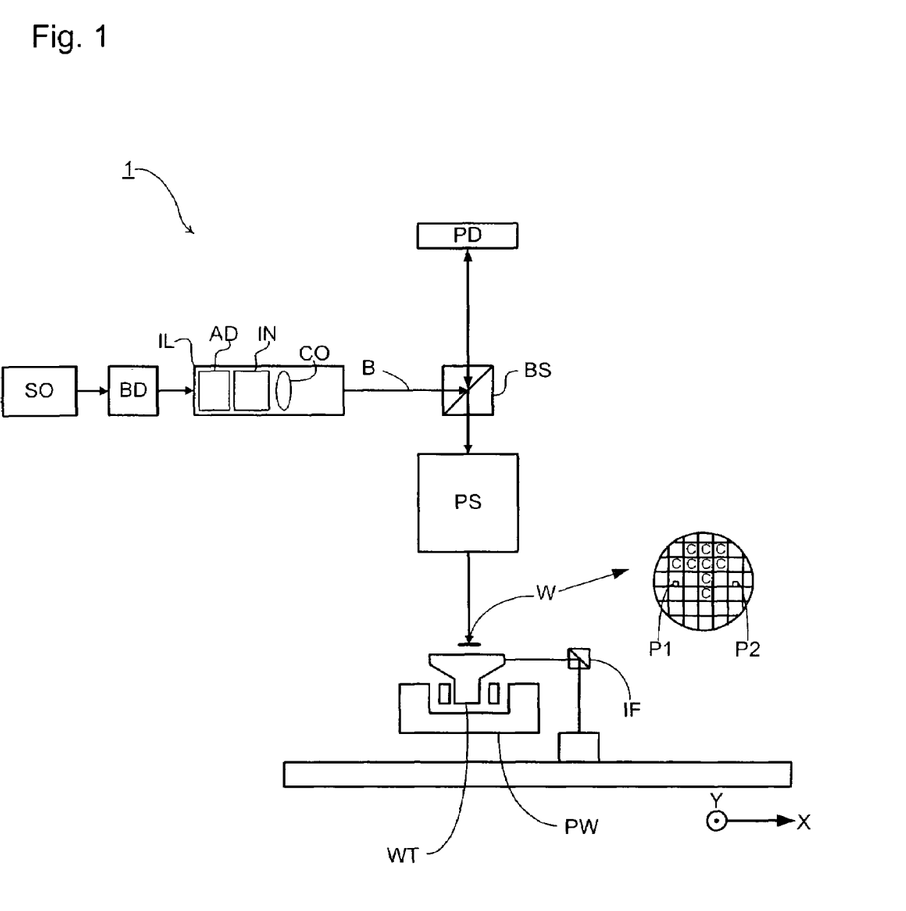
FIGS. 1 and 2 depict lithographic apparatus, according to various embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static patterning device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
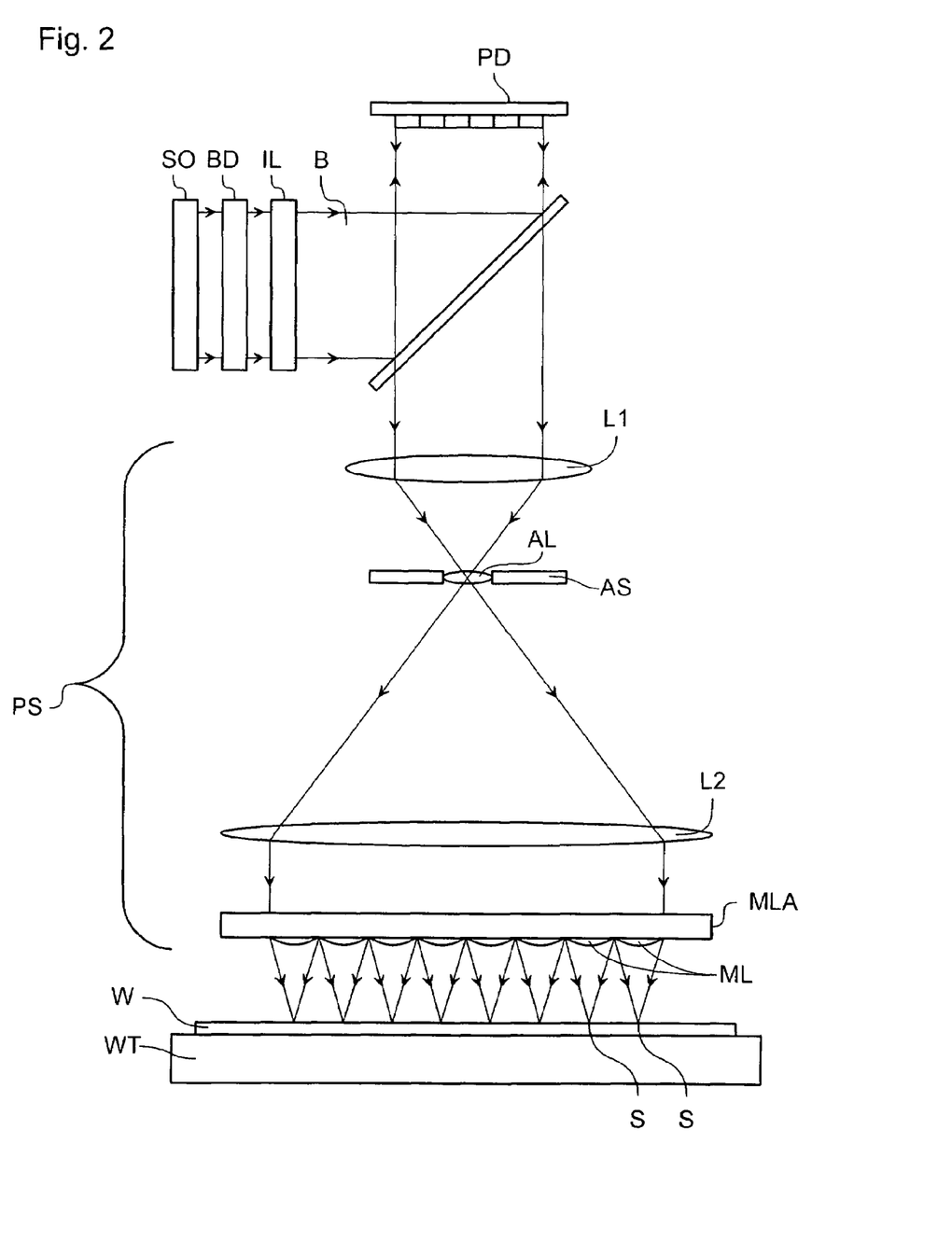

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 mm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be movable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses MLA are shown, the array of lenses can comprise many thousands of lenses (the same is true of the array of individually controllable elements used as the patterning device PD).

Figure 3:
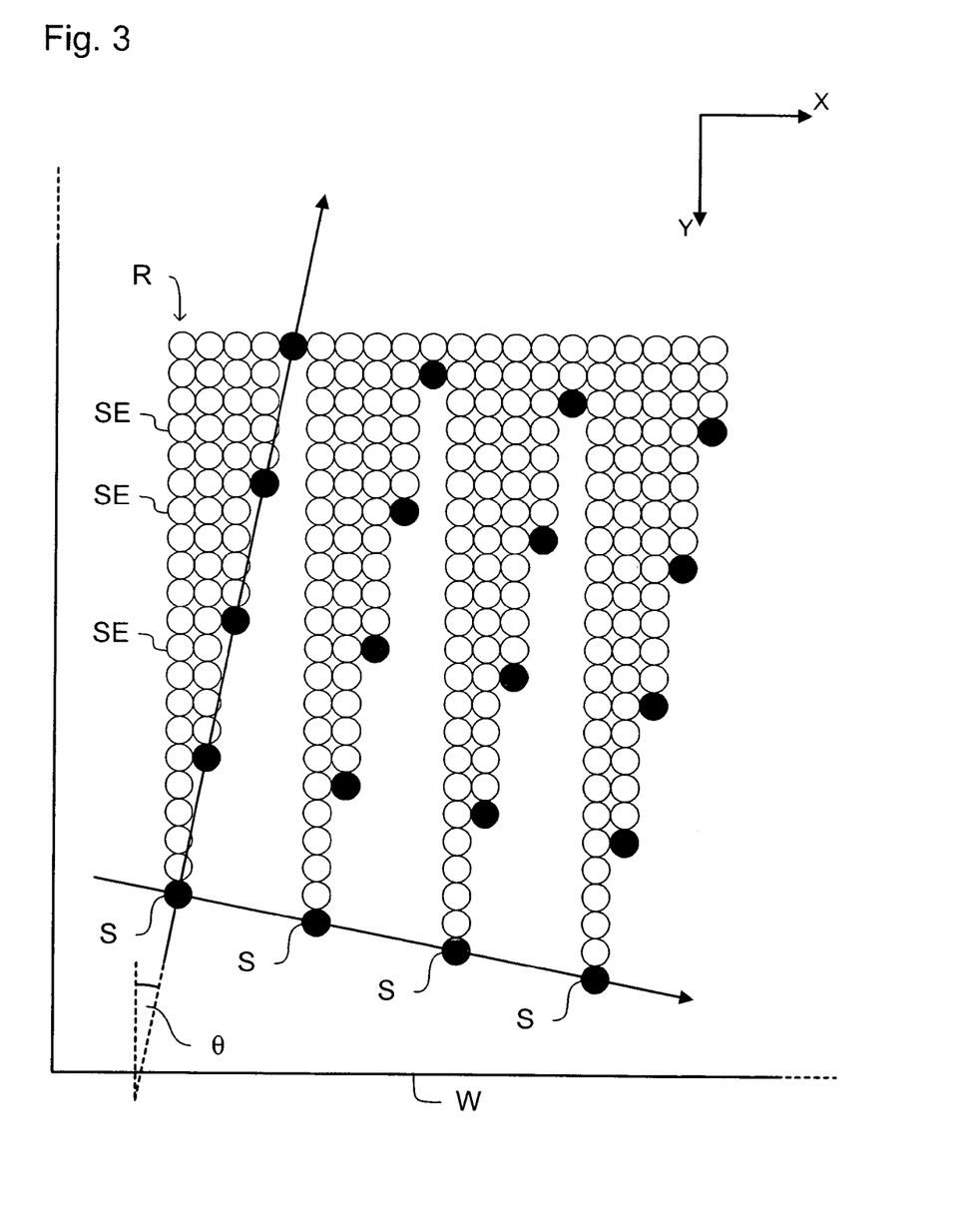
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
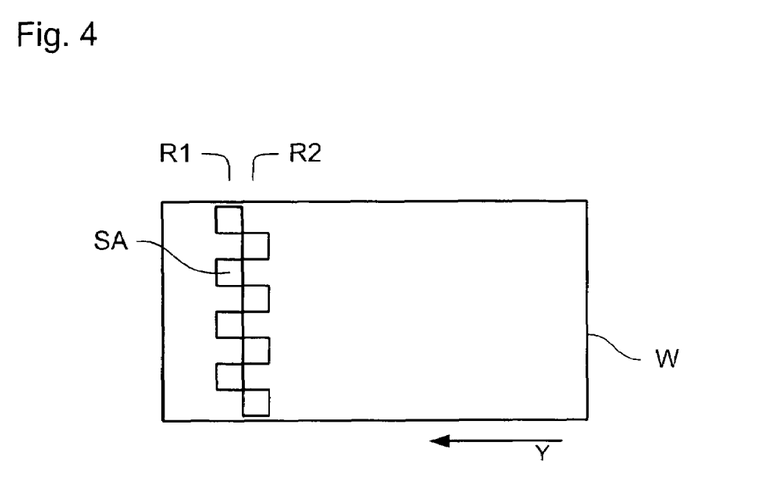
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
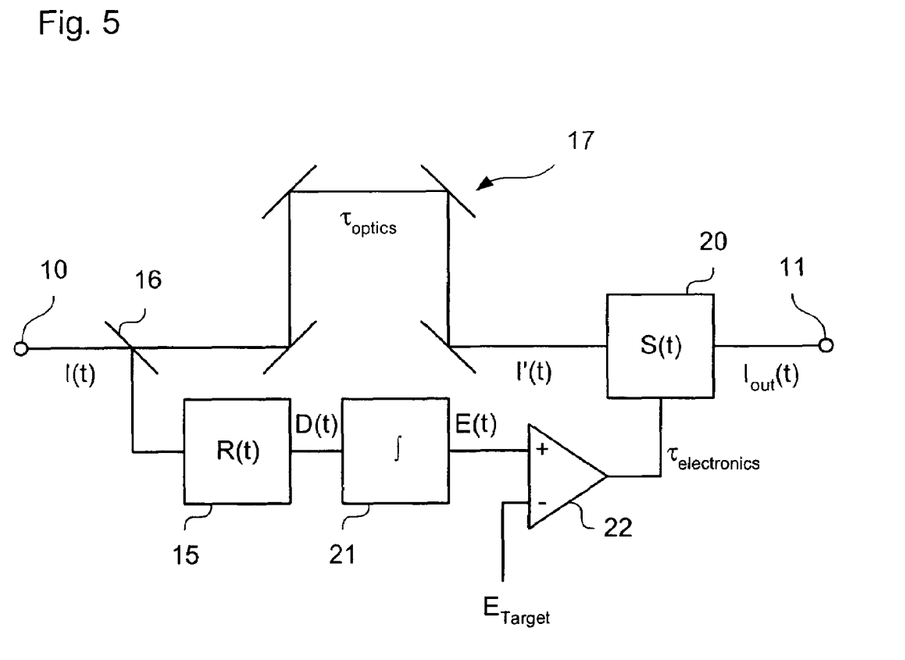
FIG. 5 depicts a radiation pulse energy control system, according to one embodiment of the present invention.

FIG. 5 depicts a radiation pulse energy control system, according to one embodiment of the present invention. A radiation pulse is input at an input 10 and output at an output 11. A detector 15 is provided to monitor the energy of the radiation pulse. A partial reflector 16 can be provided to divert a portion of an input pulse to the detector 15. The remainder of the pulse, which is expected to be the majority of the pulse energy, is passed to an optical delay line 17. Optical delay 17 can, for example, be comprised of a pair of parallel reflective surfaces arranged such that the pulse of radiation is reflected backwards and forwards between the reflective surfaces a plurality of times in order to delay the pulse of radiation. From the optical delay line 17, the pulse of radiation is directed to an optical shutter 20 which is controlled to trim a portion of the energy from the pulse of radiation. For example, the pulse of radiation can be shaped to have a time-intensity profile, such that the intensity rises relatively rapidly and then falls more slowly providing a "tail" that can be trimmed relatively accurately.

The optical shutter 20 is controlled according to the measurements made by the radiation detector 15. In the example shown in FIG. 5, the radiation detector 15 continuously measures the intensity of the radiation in each pulse and the radiation pulse energy control system is provided with an integrator 21 that measures the total energy in a pulse received by the detector 15 up to any given instant. The output of the integrator 21 is compared with a target energy for a radiation pulse by a comparator 22. When the total energy in a radiation pulse determined by the integrator 21 reaches the target value, the comparator 22 directs a signal to the optical shutter 20, instructing the optical shutter 20 to close, trimming the remainder of the pulse. Consequently, the energy of the output pulse matches the target energy. As will be apparent, delay of the optical delay line 17 needs to be set to match the delay introduced by the electronics of the detector 15, the integrator 21 and the comparator 22.

A limitation on previously known radiation pulse energy control systems similar to that depicted in FIG. 5 is that the accuracy of the control of the radiation pulse energy was limited by the switching speed of their optical shutter. Clearly, even if the triggering of the optical shutter is precisely timed to a particular time instant within a pulse of radiation, if the switching time of the optical shutter is of the same order of magnitude as the duration of the pulse (or even longer), the control of the energy within a pulse will be poor. The situation can be made worse if the shape of the radiation pulse time-intensity curve varies because it will not be possible consistently to compensate for the switching speed of the optical shutter.

However, this embodiment or example of the present invention overcomes the above problem by setting the speed of response of the radiation detector 15 to be the same as the speed of response of the optical shutter 20. Accordingly, if an optical shutter 20 with a slow response time needs to be used, for example in order to use a material with a long lifetime and a relatively high transmissivity when open, an equally slow radiation detector 15 is used. The response rate of the detector 15 can be controlled by tuning the electrical components that comprise the detector 15. In one example, the detector 15 should be tuned such that the shape of its step response matches that of the optical shutter but is inverted in time.

Figure 6A:
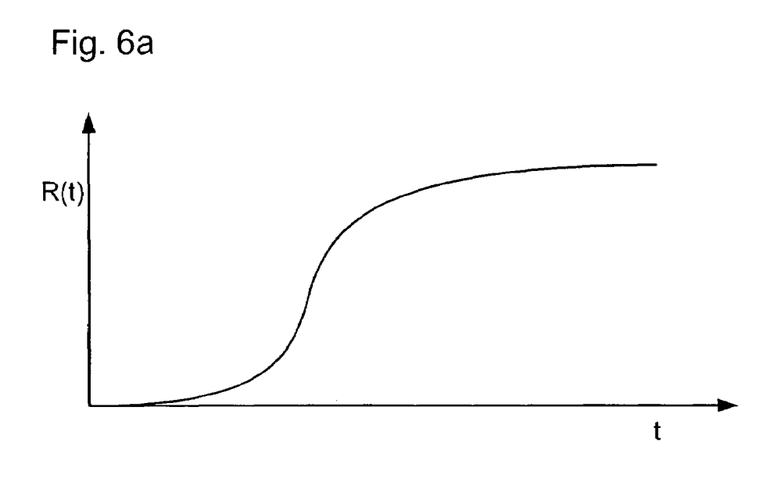
FIGS. 6A and 6B show detection of impulse responses of a radiation detector and an optical shutter, respectively, of a radiation pulse energy control system, according to one embodiment of the present invention.
Figure 6B:
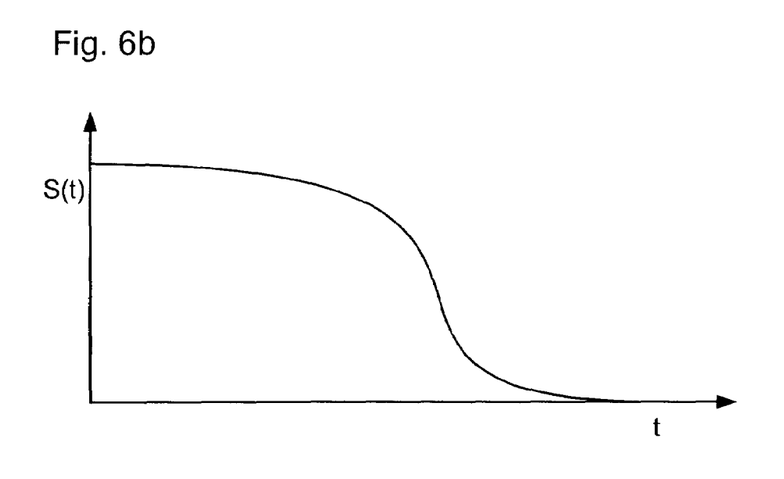

FIGS. 6a and 6b depict exemplary step responses for the detector 15 and optical shutter 20, respectively. That the unexpected result of the present invention, namely that if one wishes to use a lower performance optical shutter 20 (i.e., having a slower response rate) one should use a lower (and not higher) performance detector 15 (i.e., also having a slower response rate) is demonstrated below:

$I(t)$=The intensity of the radiation pulse as a function of time $I'(t)$=The radiation pulse after the optical delay line $\tau_{OPTICS}$ $I'(t)=I(t-\tau_{OPTICS})$ $I_{OUT}(t)$=The trimmed radiation pulse $S(t)$ = The step response of the transmission of the Optical Shutter $S(t) = 1, t < 0$ $S(t) = 0, t > \tau_{CLOSED}$ $R(t)$ = The impulse response of detector $R_{STEP}(t)$ = The step response of the detector $$R_{step}(t) = \int_{-\infty}^{t} R(t) \cdot dt \qquad \text{Eq. 1}$$

$D(t)$ = The output signal from the detector $E(t)$ = The integrated detector signal $E_{TARGET}$ = The target energy of the output pulse $t_{SWITCH}$ = moment in time when the integrated detector signal $E(t)$ reaches $E_{TARGET}$ $\tau_{ELECTRONICS}$ = delay time in the electronics Depending on the switching moment $t_{SWITCH}$ the total energy of the output pulse is given by:

$$E_{OUT} = \int_{-\infty}^{\infty} I_{OUT}(t) \cdot dt \qquad \text{Eq. 2}$$

$$= \int_{-\infty}^{\infty} I(t - \tau_{OPTICS}) \cdot S(t - t_{SWITCH} - \tau_{ELETRONICS}) \cdot dt$$

The detector output signal $D(t)$ is given by the convolution of the laser pulse $I(t)$ and the detector impulse response $R(t)$:

$$D(t) = I \otimes R = \int_{-\infty}^{\infty} I(\tau) \cdot R(t - \tau) \cdot d\tau \qquad \text{Eq. 3}$$

The integrated detector signal $E(t)$ is then given by:

$$E(t) = \int_{-\infty}^{t} D(t) \cdot dt \qquad \text{Eq. 4}$$

$$= \int_{-\infty}^{t} \int_{-\infty}^{\infty} I(\tau) \cdot R(t - \tau) \cdot d\tau \cdot dt$$

Changing the order of integration gives:

$$E(t) = \int_{-\infty}^{\infty} \int_{-\infty}^{t} I(\tau) \cdot R(t - \tau) \cdot dt \cdot d\tau \qquad \text{Eq. 5}$$

$$= \int_{-\infty}^{\infty} I(\tau) \cdot \left( \int_{-\infty}^{t} R(t - \tau) \cdot dt \right) \cdot d\tau$$

$$= \int_{-\infty}^{\infty} I(\tau) \cdot \left( \int_{-\infty}^{t-\tau} R(t) \cdot dt \right) \cdot d\tau$$

The integral of the detector impulse response equals the detector step response (eq. 1). Inserting this in eq. 5 gives:

$$E(t) = \int_{-\infty}^{\infty} I(\tau) \cdot \left( \int_{-\infty}^{t-\tau} R(t) \cdot dt \right) \cdot d\tau \qquad \text{Eq. 6}$$

$$= \int_{-\infty}^{\infty} I(\tau) \cdot R_{STEP}(t - \tau) \cdot d\tau$$

By definition at the moment $t_{SWITCH}$ the integrated signal $E(t)$ equals $E_{TARGET}$:

$$E(t_{SWITCH}) = \int_{-\infty}^{\infty} I(\tau) \cdot R_{STEP}(t_{SWITCH} - \tau) \cdot d\tau \qquad \text{Eq. 7}$$

$$= E_{TARGET}$$

if $R_{STEP}(t)$ is the time inverse of $S(t)$, it follows that:

$$R_{STEP}(t) = S(\tau_{CLOSED} - t) \qquad \text{Eq. 8}$$

Replacing $R_{STEP}$ with $S$ in equation 7 gives:

$$E_{TARGET} = \int_{-\infty}^{\infty} I(\tau) \cdot R_{STEP}(t_{SWITCH} - \tau) \cdot d\tau \qquad \text{Eq. 9}$$

$$= \int_{-\infty}^{\infty} I(\tau) \cdot S(\tau + \tau_{CLOSED} - t_{SWITCH}) \cdot d\tau$$

Replacing $\tau$ by $t - \tau_{OPTICS}$ in equation 9 gives:

$$E_{TARGET} = \qquad \text{Eq. 10}$$

$$\int_{-\infty}^{\infty} I(t - \tau_{OPTICS}) \cdot S(t - \tau_{OPTICS} + \tau_{CLOSED} - t_{SWITCH}) \cdot dt$$

When the optical time delay $\tau_{OPTICS}$ is adjusted to match the electronics and the optical shutter:

$$\tau_{OPTICS} = \tau_{ELECTRONICS} + \tau_{CLOSED} \qquad \text{Eq. 11}$$

Then equation 10 can be re-written as:

$$E_{TARGET} = \int_{-\infty}^{\infty} I(t - \tau_{OPTICS}) \cdot S(t - t_{SWITCH} - \tau_{ELECTRONICS}) \cdot dt \qquad \text{Eq. 12}$$

The integral in equation 12 equals the integral in equation 2 and consequently it is proven that $$E_{OUT} = E_{TARGET} \qquad \text{Eq. 13}$$

Accordingly, it is shown that the energy of the radiation pulse output from the radiation pulse energy control system matches the desired energy and is independent of the energy of the radiation pulse input to the control system and independent of the shape of the intensity-time profile of the pulse. Furthermore, the accuracy of the control of the energy in the output pulse of radiation ceases to be dependent on the absolute switching speed of the optical shutter but, instead, is dependent on the accuracy of the matching of the response of the detector to the response of the optical shutter.

It will be appreciated that in one example in order for the energy of the output pulse of radiation to be consistent, the energy of the pulse of radiation input to the radiation pulse energy control system must always be greater than the target energy. Accordingly, target energy must be set at a value no greater than the lowest pulse energy that is expected to be input to the radiation pulse energy control system.

A major benefit of the arrangement of this example of the present invention, in which the detector response is matched to the response of the optical shutter, is that the required switching speed of the optical shutter can be relaxed without affecting the accuracy of the control of the energy of the radiation pulses. Accordingly, the optical shutter can be optimized for other features. In addition, slower optical shutter mechanisms can be considered.

In one example, because the accuracy of the control of the energy of the output pulses of radiation ceases to be dependent on the absolute switching speed of the optical shutter, it becomes possible to control the energy of pulses of radiation in which the time taken for the shutter to close is greater than the duration of the pulse of radiation. For example, when using a Pockels cell as the optical shutter with a shutter time of between about 10 and 20 ns and a detector with a matched step response, it is possible to trim the energy of radiation pulses in the sub-nano second or even sub-pico second regime.

It should be appreciated that the radiation pulse energy control system of this example of the present invention can be used as part of a radiation source, in particular a laser, and further in particular an excimer laser, in order to provide a radiation source generating pulses of radiation that have consistent energy levels. In addition, the radiation pulse energy control system can be used as part of a lithographic apparatus. For example, the radiation pulse energy control system can be configured to adjust the energy of the pulses of radiation that are input to, or output from, the illuminator.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A radiation pulse energy control system configured to control energy in a pulse of radiation passing through the system, comprising:

a radiation detector that is configured to monitor the energy in the pulse of radiation; and an optical shutter that is configured to close in response to the radiation detector in order to trim part of the pulse of radiation passing through the system, wherein the radiation detector is configured such that a speed of response of the radiation detector equals a speed of response of the optical shutter.

2. The radiation pulse energy control system of claim 1, wherein the radiation detection is configured to produce a step response curve and the optical shutter is configured to produce a step response curve, such that the step response of the radiation detector substantially matches the step response of the optical shutter inverted in time.

3. The radiation pulse energy control system of claim 1, further comprising:

a controller that is configured to control the energy of the pulse of radiation passing through the system to be a given energy level, wherein the controller is configured to trigger the optical shutter to close when it is determined that the total energy in the pulse that has reached the radiation detector is the given energy level.

4. The radiation pulse energy control system of claim 1, wherein an amount of time taken for the shutter to close is greater than a duration of the pulse of radiation passing through the system.

5. The radiation pulse energy control system of claim 1, wherein the optical shutter comprises at least one of a Pockels cell and an interferometer.

6. The radiation pulse energy control system of claim 1, further comprising:

an optical delay line configured to delay the pulse of radiation passing through the system after the radiation detector has monitored the energy of the pulse and before the pulse reaches the optical shutter.

7. A laser, comprising:

a radiation detector that is configured to monitor energy in a pulse of radiation; and an optical shutter that is configured to close in response to the radiation detector in order to trim part of the pulse of radiation passing through the system, wherein the radiation detector is configured such that a speed of response of the radiation detector equals a speed of response of the optical shutter.

8. A lithographic apparatus, comprising:

an illuminator configured to condition a pulsed beam of radiation;

a radiation pulse energy control system configured to control energy in the pulse of radiation passing through the system, the radiation pulse energy control system comprising a radiation detector that is configured to monitor energy in a pulse of radiation, and an optical shutter that is configured to close in response to the radiation detector in order to trim part of the pulse of radiation passing through the system, wherein the radiation detector is configured such that a speed of response of the radiation detector equals a speed of response of the optical shutter;

a patterning device configured to pattern the pulse of radiation leaving the shutter; and a projection system configured to project the patterned beam onto a target portion of a substrate.

9. A device manufacturing method including modulating a pulsed beam of radiation and projecting the modulated beam onto a substrate, the method comprising:

monitoring energy in the pulse of radiation using a radiation detector; and trimming the pulse of radiation through closure of an optical shutter, wherein a speed of response of the radiation detector is equal to a speed of response of the optical shutter.

10. An integrated circuit device manufactured according to the method of claim 9.

11. A flat panel display manufactured according to the method of claim 9.

* * * * *